US012761994B2

(12) United States Patent
Wu et al.

(10) Patent No.: US 12,761,994 B2
(45) Date of Patent: Oct. 13, 2026

(54) BLOCK HEALTH CHARGE LOSS DETECTION FOR BLOCK RETIREMENT IN A MEMORY SUB-SYSTEM

(71) Applicant: Micron Technology, Inc., Boise, ID (US)

(72) Inventors: Fanqi Wu, Sunnyvale, CA (US); Zhenlei Shen, Milpitas, CA (US); Jiangli Zhu, San Jose, CA (US); Tingjun Xie, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 32 days.

(21) Appl. No.: 18/935,129

(22) Filed: Nov. 1, 2024

(65) Prior Publication Data

US 2025/0147831 A1 May 8, 2025

Related U.S. Application Data

(60) Provisional application No. 63/596,807, filed on Nov. 7, 2023.

(51) Int. Cl.

| | |
|---|---|
| ***G11C 16/34*** | (2006.01) |
| ***G06F 11/07*** | (2006.01) |
| *G11C 11/56* | (2006.01) |
| *G11C 16/26* | (2006.01) |
| *G11C 29/52* | (2006.01) |

(52) U.S. Cl.

CPC ........ *G06F 11/0754* (2013.01); *G06F 11/073* (2013.01); *G06F 11/0751* (2013.01); *G11C 16/34* (2013.01); *G11C 11/5642* (2013.01); *G11C 16/26* (2013.01); *G11C 16/3459* (2013.01); *G11C 29/52* (2013.01)

(58) Field of Classification Search

CPC .... G06F 11/0754; G06F 11/073; G11C 29/52; G11C 16/34

See application file for complete search history.

(56) References Cited

U.S. PATENT DOCUMENTS

| | | | | |
|---|---|---|---|---|
| 9,478,303 | B1 * | 10/2016 | Parker | G11C 29/50004 |
| 9,547,571 | B2 * | 1/2017 | Yang | G11C 16/3404 |
| 10,242,747 | B1 * | 3/2019 | Patel | G11C 16/08 |
| 2009/0052269 | A1 * | 2/2009 | Moschiano | G11C 16/34 365/230.03 |
| 2012/0151260 | A1 * | 6/2012 | Zimmermann | G11C 16/3431 711/E12.002 |
| 2015/0332772 | A1 * | 11/2015 | Kim | G11C 11/5635 365/185.18 |
| 2015/0357043 | A1 * | 12/2015 | Im | G11C 16/32 365/185.11 |
| 2021/0358556 | A1 * | 11/2021 | Kavalipurapu | G11C 16/0483 |
| 2022/0051727 | A1 * | 2/2022 | Gwak | G11C 16/10 |
| 2023/0017995 | A1 * | 1/2023 | Xu | G11C 16/3431 |

(Continued)

*Primary Examiner* — Jonathan D Gibson

(74) *Attorney, Agent, or Firm* — Lowenstein Sandler LLP

(57) ABSTRACT

A processing device in a memory sub-system identifies a read error associated with a block and determines a charge loss value associated with the block. The processing device determines whether the charge loss value is greater than or equal to a charge loss threshold. Responsive to determining the charge loss value is greater than or equal to the charge loss threshold, the block is identified as a healthy block.

20 Claims, 6 Drawing Sheets

(56) References Cited

U.S. PATENT DOCUMENTS

| | | | | |
|---|---|---|---|---|
| 2023/0268014 | A1* | 8/2023 | Besinga | G06F 12/0215 |
| | | | | 365/185.22 |
| 2024/0304264 | A1* | 9/2024 | Hu | G11C 16/3418 |
| 2025/0104796 | A1* | 3/2025 | Wan | G11C 29/021 |
| 2025/0147831 | A1* | 5/2025 | Wu | G06F 11/0754 |

* cited by examiner

BLOCK HEALTH CHARGE LOSS DETECTION FOR BLOCK RETIREMENT IN A MEMORY SUB-SYSTEM

RELATED APPLICATION

This application claims the benefit of U.S. Provisional Application No. 63/596,807 filed Nov. 7, 2023, the entire contents of which are hereby incorporated by reference.

TECHNICAL FIELD

Embodiments of the disclosure relate generally to memory sub-systems, and more specifically, relate to a block health charge loss detection for block retirement in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various aspects of the disclosure.

DETAILED DESCRIPTION

Figure 1:
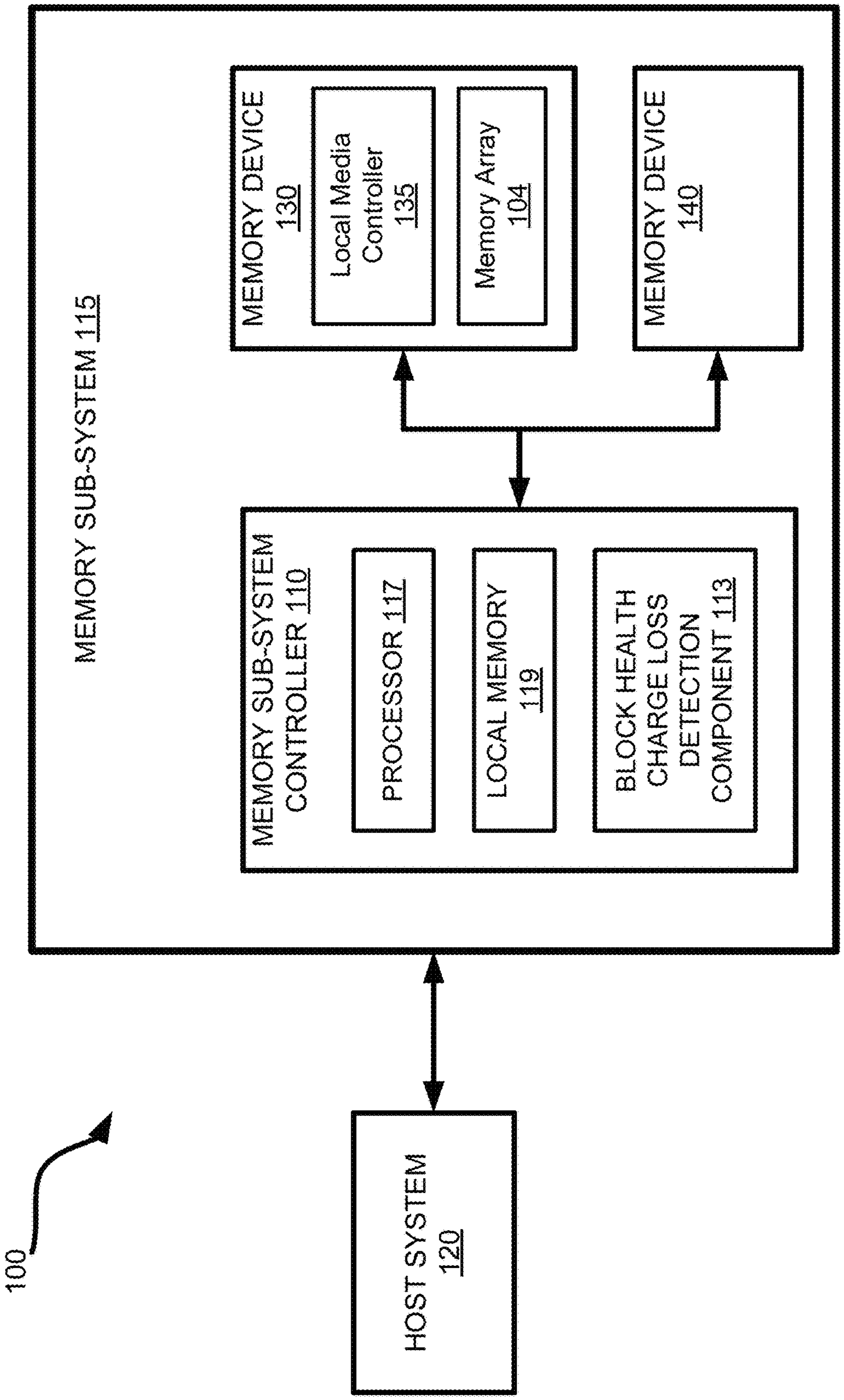
FIG. 1 illustrates an example computing system that includes a memory sub-system in accordance with some aspects of the disclosure.

Aspects of the present disclosure are directed to a block health charge loss detection for block retirement in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where data retention of data is desired when no power is supplied to the memory device.

For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

One example of a memory sub-system is a solid-state drive (SSD) that includes one or more non-volatile memory devices and a memory sub-system controller to manage the non-volatile memory devices. A given segment of one of those memory devices (e.g., a block) can be characterized based on the programming state of the memory cells associated with wordlines contained within the segment. When data is written to a memory cell of the segment for storage, the memory cell can deteriorate. This can cause the memory sub-system to experience a read failure at the memory cell or segment of memory (e.g., a block). Three mechanisms that potentially lead to read failure include: intrinsic NAND defect, intrinsic cell degradation, and extrinsic media stress. An "intrinsic NAND defect" can include physical defects to the segment of memory due to, for example manufacturing errors or damage sustained at the location where the memory sub-system is operating (e.g., damage sustained by the memory sub-system from being dropped). "Intrinsic cell degradation" can include memory segments that, due to repeated memory access operations (e.g., program/erase cycling) can no longer reliably store data. Accordingly, each memory cell of the segment can handle a finite number of memory operations performed before the memory cell is no longer able to reliably store data. "Extrinsic media stress" can include stresses on the segment of memory due to a number of factors, read disturb, slow charge loss, the passage of time, change in temperature, etc. For example, when data has been stored in the memory cells of a block for an extended period of time (e.g., in a datacenter), so called "data retention" stress can lead to significant levels of charge loss during that period of time (e.g., a data retention duration).

When performing certain memory access operations, the algorithms of the memory sub-system controller can attempt to read the data in one or more blocks of the drive. However, it is possible that memory sub-system controller fails to read data from a block because of a physical defect of the block (e.g., an intrinsic NAND defect or intrinsic cell degradation), or a logical defect of the block (e.g., extrinsic media stress that alters the charge states of the memory cells in the block). Altered charge states of memory cells in the block can include charge loss. For example, the charge loss can cause the margins between programming distributions to collapse making the data in different memory cells unreadable. However, some memory sub-systems are unable to distinguish between the different mechanisms that can cause read failures, and instead simply retire all blocks with a read failure as read grown bad blocks (GBBs). GBBs are "bad blocks" that have experienced intrinsic cell degradation. Bad blocks are blocks that do not reliably store data due to a physical defect, such as blocks with intrinsic NAND defects, and blocks with intrinsic cell degradation (e.g., GBBs). A block that causes a read failure (e.g., due to extrinsic media stress) that can be reformatted and reused is not a bad block. Accordingly, memory sub-systems can be forced to retire any block that meets a defined bad block criterion (e.g., blocks for which certain uncorrectable error handling steps are triggered), even though such blocks might be intrinsically good blocks that could be reformatted and reused. This can detrimentally impact the capacity and lifespan of the drive. In a particular example, blocks on drives which are operating beyond defined specifications of the drive (which might dictate a certain time period and temperature range for which the data is still recoverable), might experience a higher quantity of read failures. While data stored on the drives might be unrecoverable, it might be practical for certain users/customers to reformat and reuse the drives with new programmed data.

Aspects of the present disclosure address the above and other deficiencies by utilizing a block health charge loss detection component for block retirement in the memory sub-system. The block health charge loss detection component can allow blocks that suffered a read error, but are determined to be otherwise healthy, (based on a charge loss associated with the block), to be reformatted and reused (e.g., erased and reprogrammed with new data). Healthy blocks are physical blocks of the memory device that are capable of reliably storing data despite suffering a read error (i.e., a failure to reliably store the current data (or most recently stored data) due to extrinsic media stress). After an error corresponding to a block of the memory device is detected in the memory sub-system, the block health charge loss detection component can determine whether the block is a healthy block (e.g., capable of reliably storing data) or an unhealthy block (e.g., a block not capable of reliably storing data, such as a GBB). Unhealthy blocks can include grown bad blocks (GBBs) which, as described above are blocks that no longer reliably store charges due to intrinsic cell degradation resulting from repeated stresses (e.g., repeated memory access operations).

To determine whether a block associated with a read error is a healthy block, the block health charge loss detection component can determine a charge loss value associated with the block, and responsive to determining the charge loss value is greater than or equal to a charge loss threshold, identify the block as a healthy block. Due to extrinsic media stress, healthy blocks that have retained data, especially for an extended period of time, are more likely to experience a read failure due to charge loss in the block. Extrinsic media stress will generally affect all blocks similarly, and thus a larger charge loss due to a longer data retention duration does not necessarily indicate that the block is a bad block (e.g., a grown bad block, "GBB"). A block that is a GBB will experience a read failure due to factors other than a mere charge loss over time. Thus, if the determined charge loss value is less than the charge loss threshold, the block health charge loss detection component can identify the block as a retirement candidate. For example, and in some embodiments, a block can fail (e.g., can be a GBB) such that the charge loss of the failed block can appear minimal when compared to default or programmed voltage distribution. Because blocks are generally uniformly affected by extrinsic media stress, blocks with outlier charge loss values (including charge loss values that are lower than the charge loss values of other blocks) can be identified as a bad block (e.g., a GBB).

In some embodiments, the block health charge loss detection component can determine the charge loss using memory device data state metrics. "Data state metric" herein refers to a quantity that is measured or inferred from the state of data stored on the memory device. Data state metrics can be used to characterize voltage distributions, and can reflect (i.e., is equal to or derived by a known transformation from) the state of slow charge loss, the degree of latent read disturb, the temporal voltage shift, and/or other measurable functions of the data state. For example, the data state metric can be represented by the raw bit error rate (RBER), which is the number of bit error experienced by a given data block per unit of time. Data state metrics can reflect the failed byte count (CFByte) and/or the failed bit count (CFBit) for a given set of memory cells. CFByte reflects the number of bytes in the sensed data that have at least one non-conducting bitline. In some embodiments, CFByte can reflect the number of bytes in the sensed data where the last bitline of the byte is a non-conducting bitline. CFBit reflects the number of non-conducting bitlines in the sensed data.

Advantages of the approach described herein include, but are not limited to, improved performance in the memory sub-system. For example, the block health charge loss detection component for block retirement can support certain customer usage modes by allowing reformatting and reuse of blocks in the memory sub-system after long periods data retention (e.g., data retention durations). The block health charge loss detection component can prevent unnecessary retirement of intrinsically good blocks which increases capacity and lifespan of the memory sub-system. In addition, the techniques described herein preserve system resources by reducing the number of blocks that might be miscategorized as GBBs during operation of the memory sub-system, and avoid over-provisioning loss due to unnecessary block retirement.

FIG. 1 illustrates an example of a computing system 100 that includes a memory sub-system 110 in accordance with some aspects of the disclosure. The memory sub-system 110 can include media, such as one or more volatile memory devices (e.g., memory device 140), one or more non-volatile memory devices (e.g., one or more memory device(s), such as memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT)

enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., the one or more memory device(s) such as memory device 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

Memory device 130 and memory device 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include not-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s), such as memory device 130, can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each memory device 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory device 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, electrically erasable programmable read-only memory (EEPROM).

A memory sub-system controller 115 (or memory sub-system controller 115 for simplicity) can communicate with the memory device(s) (e.g., memory device 130) to perform operations such as reading data, writing data, or erasing data at the memory device 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) (e.g., memory device 130). The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device 130. The memory sub-system controller 115 can further include host interface circuitry to communicate with the host system 120 via the physical host interface. The host interface circuitry can convert the commands received from the host system into command instructions to access the memory device(s) (e.g., memory device 130) as well as convert responses associated with the memory device(s) (e.g., memory device 130) into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device(s) (e.g., memory device 130).

In some embodiments, the memory device(s) (e.g., memory device 130) include local media controllers 135 that operate in conjunction with memory sub-system controller 115 to execute operations on one or more memory cells of the memory device(s) (e.g., memory device 130). An external controller (e.g., memory sub-system controller 115) can externally manage the memory device 130 (e.g., perform media management operations on the memory device(s) (e.g., memory device 130)). In some embodiments, a memory device 130 is a managed memory device, which is a raw memory device (e.g., memory array 104) having control logic (e.g., local media controller 135) for media management within the same memory device package. An example of a managed memory device is a managed NAND (MNAND) device. Memory device(s) (e.g., memory device 130), for example, can each represent a single die having some control logic (e.g., local media controller 135) embodied thereon. In some embodiments, one or more components of memory sub-system 110 can be omitted.

In some embodiments, the memory sub-system 110 includes a block health charge loss detection component 113 that can determine whether a read failure is due to an intrinsic NAND defect (e.g., a bad block), intrinsic cell degradation (e.g., a GBB), or extrinsic media stress (e.g., change in charge over time resulting from changes in temperature, adjacent memory cell voltage levels, read disturb, etc.). In some embodiments, block health charge loss detection component 113 can identify a read error associated with a block of memory sub-system 110. Block health charge loss detection component 113 can determine a charge loss value associated with the block. If the charge loss value is greater than, or equal to a charge loss threshold, the block health charge loss detection component 113 can identify the block as a healthy block. In some embodiments, healthy blocks can be assigned to a healthy block pool for reuse, and/or additional processing. However, if the charge loss value is less than the charge loss threshold, the block health charge loss detection component 113 can identify the block as a retirement candidate. Retirement candidates can be retired by block health charge loss detection component 113, or by another component of memory sub-system 110 as needed. In some embodiments, retirement candidates can be assigned to a retirement pool in lieu of immediately retiring the block. In some embodiments, retirement candidates can be retired as a part of memory processes such as garbage collection. Identifying healthy blocks from unhealthy blocks (e.g., GBBs) can allow the healthy blocks or other segments of memory device 130 to be reformatted and reused (e.g., erased and reprogrammed with new data). Further details with regards to the operations of block health charge loss detection component 113 are described below.

Figure 2:
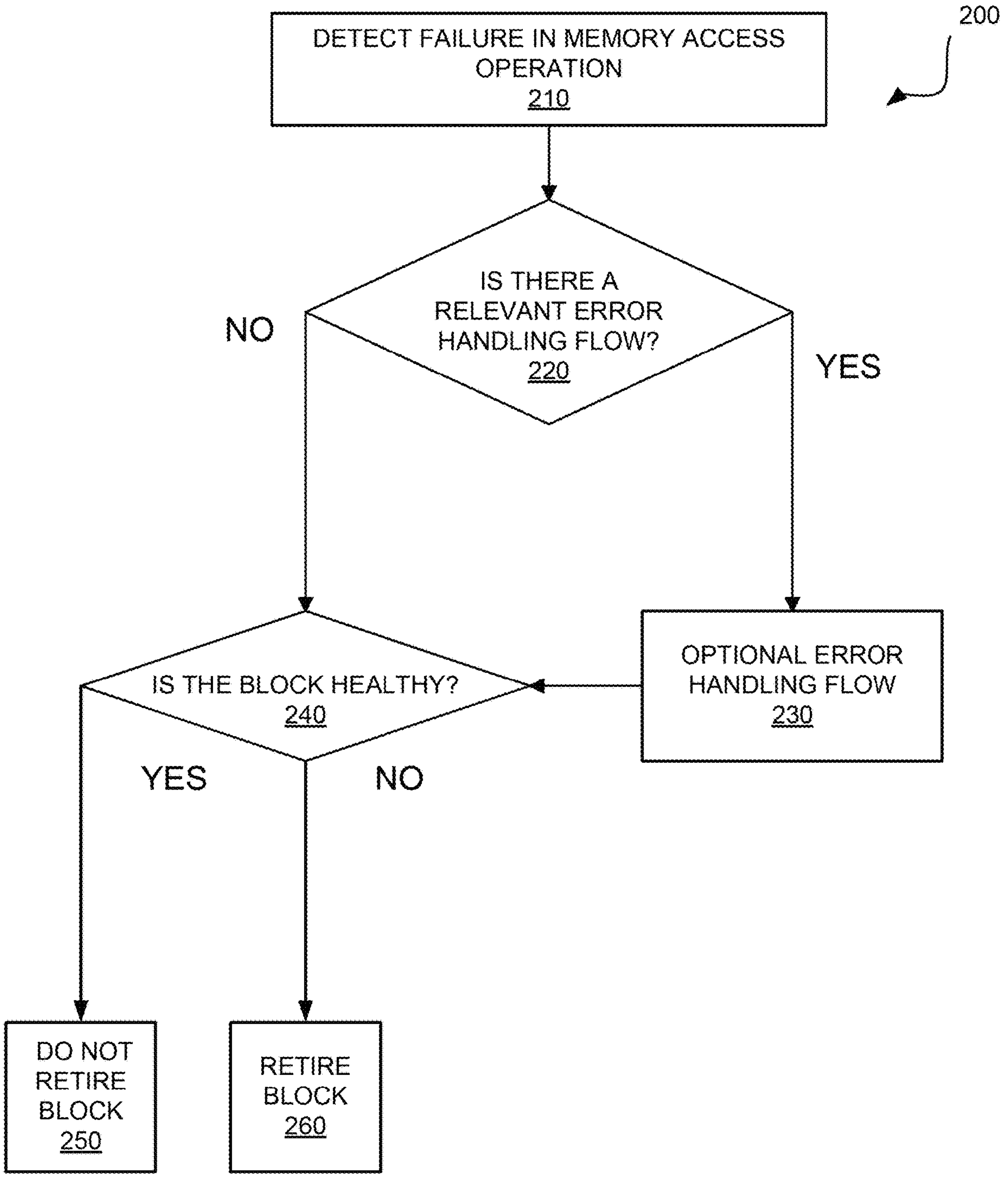
FIG. 2 is a flow diagram of an example method for identifying healthy blocks in a memory sub-system, in accordance with aspects of the disclosure.

FIG. 2 is a flow diagram of an example method for identifying healthy blocks in a memory sub-system, in accordance with aspects of the disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by block health charge loss detection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic (e.g., block health charge loss detection component 113) detects a failure in a memory access operation performed on a block of the memory sub-system 110. In some embodiments, memory access operations can perform a read strobe shortly after performing the host request (e.g., a read, program, or erase operation in response to a host request). The read strobe can return information about the voltage states of the memory cells, which can be checked against values in a database, programmed values, and/or expected voltage states. If the information returned by the read strobe does not match the expected voltage states of the memory cells, the memory sub-system 110 can indicate the block as experienced a memory access operation failure. For example, error correcting code (ECC) implemented by the memory sub-system controller 115 can examine data read from the block and identify any errors (e.g., bit-flip errors) using various techniques, such as parity information, hard and soft decoding, etc. The presence of such errors, including correctable or uncorrectable errors, can be interpreted as a failure of the memory access operation. Depending on the embodiment, the failure of the memory access operation can be the result of a read error, a write error, or an erase error. In some embodiments, processing logic can copy data stored at the block associated with the detected failure to another block to reduce loss of user data.

At operation 220, the processing logic determines, based on the memory access operation failure, whether there is a relevant error handling flow. In some embodiments, the following operation (e.g., operation 240 to determine whether the block associated with the memory access operation failure is a healthy block) can be performed in response to a termination of an error handling flow. In some embodiments, the memory sub-system 110 can enter an error handling flow in response to a memory access operation failure.

At operation 230, the processing logic enters an optional error handling flow for memory sub-system 110. In some embodiments, when an error is encountered during a read operation (e.g., a hard read failure) with respect to a memory cell (e.g., a target cell), or when a bit error rate (BER) with respect to multiple cells is exceeded, a sequence of error handling operations (or sequence of recovery steps) can be undertaken. This sequence of operations can be referred to as the error handling flow. In some embodiments, the error handling flow can include a predefined list of operations which can be sequentially performed in a set order, in an attempt to correct the error or improve the bit error rate. For example, the processing logic can perform the first operation in the predefined list, determine if the first operation is successful, and if not, proceed to the second operation. The operations in the error handling flow, and the corresponding order in which they are performed, can vary depending on the implementation. In some embodiments, however, the error handling flow can include one or more uncorrectable error recovery steps.

At operation 240, the processing logic determines whether the block associated with the memory access operation failure is a healthy block. The processing logic can determine a charge loss for a portion of the block, such as for a wordline. In some embodiments, the charge loss can be determined based on one or more data state metrics associated with the block. In some embodiments, data state metrics can be obtained by performing from one or more read strobes on a portion of a block. In some embodiments, the processing logic can measure a voltage value of a feature of a voltage distribution (e.g., obtained using data state metrics) associated with the wordline and compare the measured voltage value against a predetermined voltage value. In some embodiments, the feature of the voltage distribution can be a valley before or after the voltage distribution, a peak, a mean, median, or mode of the voltage distribution. If a resulting charge loss value (e.g., the difference between the voltage value and the predetermined voltage value) is greater than or equal to a charge loss threshold, the block is a healthy block, and the processing logic proceeds to operation 250. If the resulting charge loss value is less than the charge loss threshold, the block is not a healthy block, and the processing logic proceeds to operation 260. In some embodiments, the charge loss value can be determined as a voltage distribution shift, (e.g., a voltage distribution valley shift, or a voltage distribution peak shift). In some embodiments, the charge loss value can be measured by CFBit or other similar coarse calibration methods. In some embodiments, processing logic can interrupt processing host data to measure the charge loss value. The charge loss value can be measured in the background as a lower priority task rather than as a host operation in order to minimize latency experienced by the host.

In some embodiments, in addition to measuring the charge loss value to identify healthy blocks, processing logic can consider memory device wear-metrics associated with the block. Wear-metrics can include representative use metrics of the memory device. One example of a wear-metric can be a program-erase count (PEC) for one or more segments of the memory device 130. Memory sub-system 110 can determine the PEC for the segment which can represent a number of times that a given segment has been programmed and erased in a cycle. Depending on the embodiment, the PEC can be an average PEC of two or more segments of the memory device 130, a highest PEC of any one segment in the block, a highest PEC of any one segment of the memory device 130, or some other representative value. The representative usage metric can also be some other information that represents how much a segment of the memory device 130 has been used, and thus how much wear and degradation the segment has experienced. In some embodiments, block health charge loss detection component 113 can maintain PEC counters for the segments of memory device 130 which are incremented in response to the occurrence of each program-erase cycle on the corresponding segment.

At operation 250, the processing logic has determined the block is a healthy block and does not retire the block. Healthy blocks can be reformatted and reused as new blocks by the memory sub-system 110. In some embodiments, healthy blocks can be assigned to a healthy block pool. In some embodiments, additional processing logic can be performed with respect to healthy blocks in the healthy block pool. For example, healthy blocks in the healthy block pool can be erased and reformatted prior to being reused as new blocks by the memory sub-system 110 (not illustrated). In some embodiments, the processing logic can set a flag or change a bit in a designated register to identify the block as a healthy block.

At operation 260, the processing logic has determined the block is not a healthy block (e.g., a GBB), and retires the block. In some embodiments, GBBs can be assigned to a retirement pool. The retirement pool can process GBB retirement as a background process with minimal impact on host performance. The retirement pool can be continually processed, or can accumulate a quantity of GBBs over a period of time, and then be emptied once conditions related to the retirement pool reach respective threshold values. Conditions and respective threshold values can be based on a time the GBB has been in the retirement pool, a time since the retirement pool was empty, a quantity of GBBs in the retirement pool, or similar measurements.

Figures 3A, 3B:
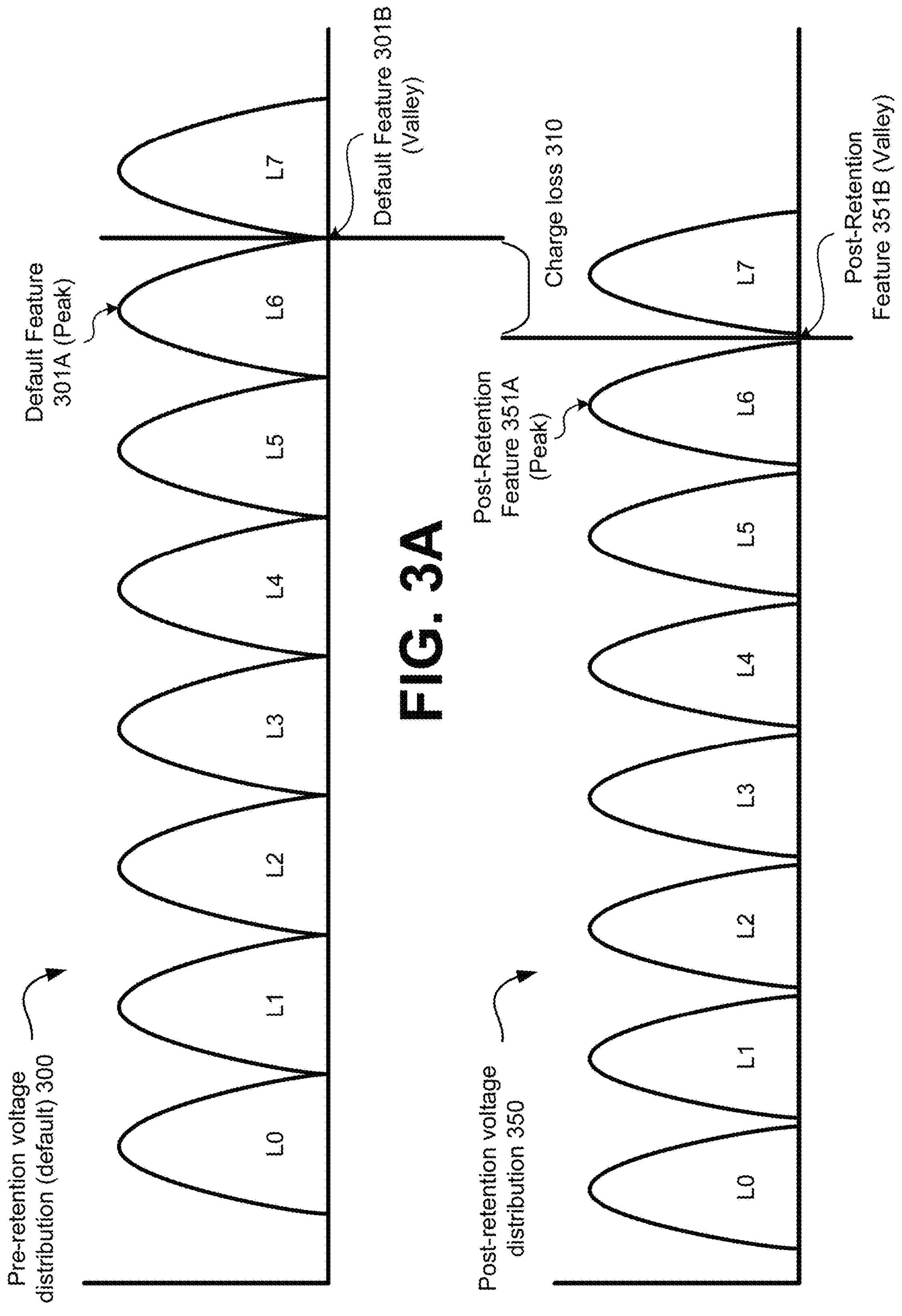
FIGS. 3A-3B illustrate examples of voltage distributions before a data retention duration and after a data retention duration, in accordance with aspects of the disclosure.

FIGS. 3A-3B illustrate examples of voltage distributions before a data retention duration, e.g., plot 300 of FIG. 3A, and after a data retention duration, e.g., plot 350 of FIG. 3B, in accordance with aspects of the disclosure.

In FIG. 3A, the plot 300 of the pre-retention (default) voltage distribution is an example of a TLC voltage distribution with voltage levels L0-L7 of a block in a memory device. A feature of the voltage distribution can, for example and in some embodiments, refer to a peak of the voltage distribution (e.g., default feature 301A) or a valley of the voltage distribution (e.g., default feature 301B). Additional features of the voltage distribution can include, for example, a median, a mean, or a mode. In some embodiments, the plot 300 can represent a programming voltage distribution of a portion of a memory device (e.g., a block, set of wordlines, etc.). In some embodiments, the pre-retention voltage distribution of plot 300 can represent a voltage distribution of the portion of the memory device shortly after the programming occurred.

In FIG. 3B, the plot 350 of the post-retention voltage distribution is an example of the same TLC volage distribution illustrated in FIG. 3A, but after a period of data retention (e.g., a data retention duration). Over time, due to extrinsic media stresses, the voltage distribution of the block can shift. In some embodiments, the shape of the voltage distribution (e.g., the distance between adjacent peaks or adjacent valleys) can change over time. In some embodiments, the charge loss experienced by healthy blocks of a memory device can depend in part on a duration of time since data was written to the block (e.g., a data retention duration). For example, and in some embodiments, the charge loss experienced by a healthy block of the memory device can be expressed as a linear- or non-linear function. In some embodiments, the rate of charge loss experienced by healthy blocks of the memory device can be different from the rate of charge loss experienced by unhealthy blocks (e.g., defective, or partially defective blocks). For example, and in some embodiments, the charge loss experienced by a healthy block in a memory device can be expressed as a function of time since data was written to the block, the charge loss experienced by an unhealthy block in the memory device can be expressed as a constant value.

Charge loss 310 in FIGS. 3A and 3B illustrate a charge loss experienced by a block after a data retention duration. Charge loss 310 can be measured between any two relative points of a voltage distribution for the same block. In the illustrative example, charge loss is measured with reference to the valley between L6 and L7 of plot 300 of the pre-retention voltage distribution and plot 350 of the post-retention voltage distribution respectively (e.g., default feature 301B, and post-retention feature 351B). While not illustrated, in the charge loss 310 can be measured between other relative points on a voltage distribution for the same block, such as between default feature 301A and post-retention feature 351A (e.g., the peak of L6). As described above, and in some embodiments, charge loss 310 can be measured using one or more data state metrics obtained from the block before the data retention (e.g., corresponding to the pre-retention voltage distribution) and one or more data state metrics obtained from the block after the data retention (e.g., corresponding to the post-retention voltage distribution).

FIGS. 3A and 3B illustrate the charge loss 310 of a healthy block (e.g., charge loss as a predictable function of time). Thus, for a time, T, a value of a charge loss threshold can be calculated. If the value of charge loss 310 is similar to the charge loss threshold (e.g., a predicted charge loss based on the data retention duration), it can indicate the block is a healthy block. If the value of charge loss 310 is not similar to the charge loss threshold, it can indicate the block is not a healthy block. For example, and in some embodiments, if the measured charge loss (e.g., charge loss 310) is greater than or equal to the estimated charge loss (e.g., the charge loss threshold), it can indicate the block is a healthy block. In some embodiments, if the charge loss 310 is less than the charge loss threshold, it can indicate the block is not a healthy block. Additional details regarding identifying healthy blocks are described below with reference to FIGS. 4-5.

Figure 4:
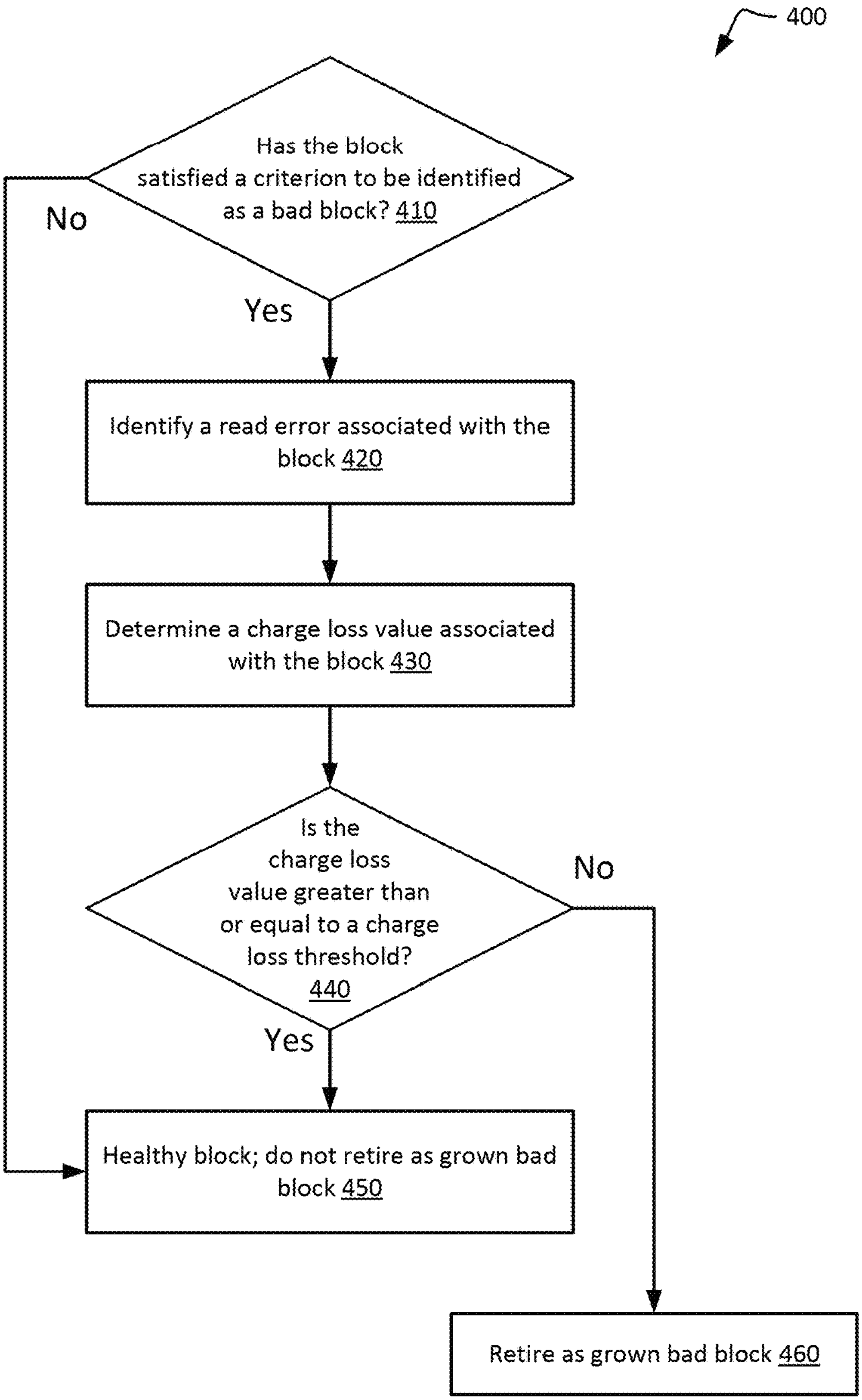
FIG. 4 is a flow diagram of a method for identifying healthy blocks in a memory sub-system based on a charge loss associated with the block, in accordance with aspects of the disclosure.

FIG. 4 is a flow diagram of an example method for identifying healthy blocks in a memory sub-system based on a charge loss associated with the block, in accordance with aspects of the disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by block health charge loss detection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic (e.g., block health charge loss detection component 113) determines whether the block has satisfied a criterion to be identified as a bad block. For example, and in some embodiments, the block can satisfy the criterion to be identified as a bad block if a read operation performed on the block has failed. In some embodiments, operation 410 can be optional, and processing logic can perform operations 420-460 as a part of an error handling flow, such as a read error handling (REH) flow. In some embodiments, operation 410 can be included in a specific operation to be performed on blocks in a memory sub-system that has exceeded the defined specifications of the memory sub-system (e.g., a certain time period and temperature range for which the data is still recoverable). In some embodiments, processing logic can determine whether a read operation performed on a block has failed.

If the block has satisfied the criterion to be identified as a bad block (e.g., "YES"), processing logic can proceed to operation 420. If the block has not satisfied the criterion to be identified as a bad block (e.g., "NO,") the block can be a healthy block, and processing logic can proceed to operation 450.

At operation 420, the processing logic identifies a read error associated with the block. In some embodiments, operation 420 can be included in a specific operation to be performed on blocks in a memory sub-system that have exceeded the defined specifications of the memory sub-system (e.g., a certain time period and temperature range for which the data is still recoverable).

At operation 430, processing logic determines a charge loss value for the block. The charge loss value can be based on a feature of a voltage distribution of the block, or a portion of the block. For example, in a TLC memory device, as illustrated in FIGS. 3A-B, the charge loss value can be based on a valley between a highest voltage distribution (e.g., an L7 voltage distribution) and a next highest voltage distribution (e.g., an L6 voltage distribution). Returning to FIG. 4, in some embodiments, processing logic can measure the voltage value of the feature of the voltage distribution, and compare the measured voltage value against a default voltage value for the given feature (e.g., an initial, or programmed voltage value). The difference between the measured voltage value and the default voltage value can be the charge loss value. The default voltage value can be based on the particular feature of the voltage distribution, such as is described above with reference to FIGS. 3A-B. In some embodiments, different portions of a block can have different charge loss values and charge loss thresholds corresponding to features of respective voltage distributions. In some embodiments. processing logic can determine which portion of the block is used to determine the charge loss value based on a predetermined order or process, memory device operation conditions, or a command from the memory sub-system. In some embodiments, the portion of the block used to determine the charge loss value can be based on the type of read error identified during operation 420. For example, and in some embodiments, a first portion of a block (e.g., a first set of wordlines) can have a first charge loss value corresponding to an L7 voltage distribution, while a second portion of a block (e.g., a second set of wordlines) can have a second charge loss value corresponding to an L7 voltage distribution. In another example, and in some embodiments, a first portion of the voltage distribution (e.g., L0-L3) can correspond to a first charge loss value (or first set of charge loss values) while a second portion of the voltage distribution (e.g., L4-L7) can correspond to a second charge loss value (or second set of charge loss values).

At operation 440, processing logic determines whether the charge loss value is greater than or equal to a charge loss threshold. In some embodiments, the charge loss threshold can correspond to an expected charge loss value. In some embodiments, the expected charge loss value can be based on a data retention duration for data stored at the block. That is, in some embodiments, the charge loss threshold corresponds to a data retention duration for data stored at the block. If the charge loss value is equal to, or greater than a charge loss threshold, processing logic can proceed to operation 450. If the charge loss value is less than the charge loss threshold, processing logic can proceed to operation 460. The charge loss threshold can be based on the particular feature of the voltage distribution. As described above, and in some embodiments, different portions of a block can have different charge loss values, and each charge loss value can correspond to respective charge loss thresholds for the corresponding feature of the voltage distribution. For example, for a highest valley of a first wordline in the block, the predetermined voltage value might be "$Y_1$" millivolts, while for a highest valley of a second wordline, the charge loss threshold might be "$Y_2$" millivolts. The charge loss threshold value can be a predetermined value that is programmed to the memory sub-system during production of the memory sub-system. In some embodiments, the charge loss threshold value can change based on a beginning of life (BOL) of the memory sub-system or an end of life (EOL) of the memory sub-system. In some embodiments, a BOL or EOL of the memory sub-system can be based on a program/erase cycle count, or another similar wear metric. In some embodiments, the charge loss threshold can be a predicted (e.g., expected) charge loss value. For example, and in some embodiments, processing logic can predict an expected charge loss value based on a data retention duration for data stored in the block. In some embodiments, processing logic can predict the expected charge loss based on one or more predetermined charge-loss tables stored in metadata. In some embodiments, processing logic can predict the expected charge loss based on one or more models corresponding to a data retention duration for data stored at the memory block. In some embodiments, the expected charge loss can be based on data retention duration for portions of the memory block and/or data retention duration for one or more memory blocks adjacent to the memory block.

At operation 450, responsive to either determining the read operation has not failed with respect to the block, or that the charge loss value is equal to or greater than the charge loss threshold, the processing logic does not retire the block. The processing logic can identify the block as a healthy block, and does not retire the block as a GBB. As described above, healthy blocks can be reformatted and reused as new blocks by the memory sub-system 110. In some embodiments, healthy blocks can be assigned to a healthy block pool. As described with reference to operation 250 of FIG. 2, additional processing logic can be performed with respect to healthy blocks in the healthy block pool. For example, and in some embodiments, processing logic can set a flag or change a bit in a designated register to identify the block as a healthy block. In some embodiments, processing logic can select blocks for writing new data from the healthy block pool.

At operation 460, responsive to determining that the charge loss value was not equal to or greater than the charge loss threshold (i.e., the charge loss value was less than the charge loss threshold), processing logic can retire the block as a grown bad block (GBB). In some embodiments, an indication that the GBB has been retired can be saved in a memory such as local memory 119. In some embodiments, processing logic can identify the block as a retirement candidate. In some embodiments, retirement candidates can be assigned to a retirement block pool. Processing logic can retire blocks from the retirement pool as a background operation. In some embodiments, retiring blocks from the retirement pool can be a part of a garbage collection operation for the memory sub-system 110.

Figure 5:
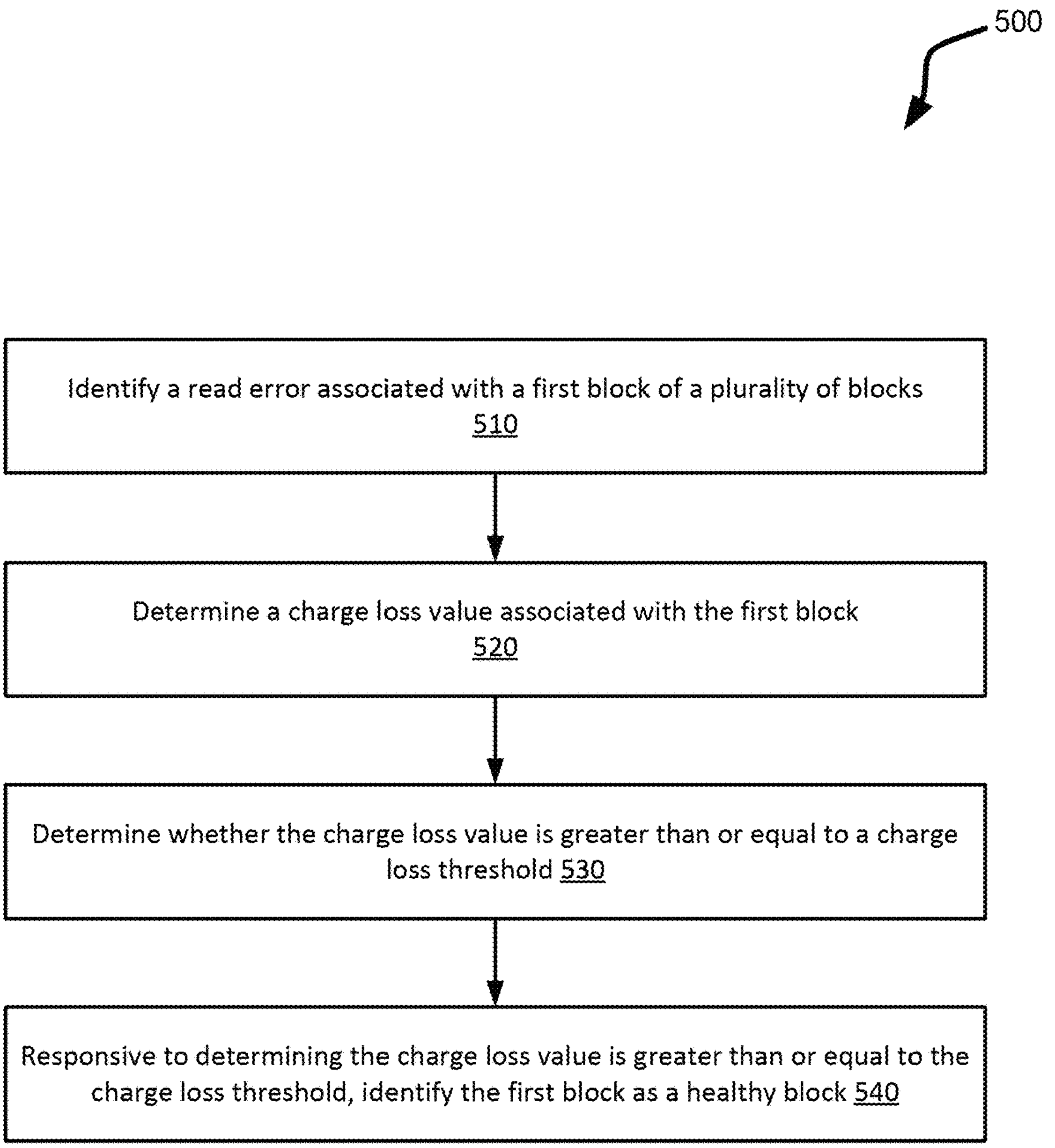
FIG. 5 is a flow diagram of a method for identifying healthy blocks in a memory sub-system based on a charge loss associated with the block, in accordance with aspects of the disclosure.

FIG. 5 is a flow diagram of an example method for identifying healthy blocks in a memory sub-system based on a charge loss associated with the block, in accordance with aspects of the disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by block health charge loss detection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, processing logic (e.g., block health charge loss detection component 113) identifies a read error associated with a block among multiple blocks. Although the block might appear to be an unhealthy block, such as a block that has failed due to deterioration of the underlying physical media (e.g., the block has preliminarily been identified as a bad block), the controller can perform method 500 to confirm whether the block is an intrinsically good block that is able to be reused for storing data, and merely suffered significant charge loss due to extrinsic media stress associated with a period of data retention (e.g., a data retention duration). In some embodiments, processing logic can copy data stored at the block to a second block to reduce the risk of losing host data. In some embodiments, the data contents of the block (e.g., host data, etc.) are irrelevant. In some embodiments, processing logic can identify an error recovery flow that has been performed with respect to the read error associated with the block. In some embodiments, processing logic can decline to proceed to operation 520 until after the error recovery flow has finished. In some embodiments, the memory sub-system 110 can indicate that processing logic should proceed to operation 520 before an error recovery flow for the block has finished. In some embodiments, processing logic can determine that the block has satisfied a criterion to be identified as a bad block, and before retiring the bad block, can proceed through operations 520-540. In some embodiments, such criterion and subsequent identification of the block as a bad block can be preliminary, and can be the result of a failure in an error handling flow. In some embodiments, the preliminary identification of the block as a bad block can be triggered by one or more operations performed by the memory device (such as an operation within an error handling flow). For example, and in some embodiments, a block can preliminarily be identified as a bad block when a redundant array of independent NAND (RAIN) operation is performed on the block.

At operation 520, processing logic determines a charge loss value associated with the block. In some embodiments, the charge loss value can be determined by determining a voltage value corresponding to a feature of a voltage distribution associated with the block, and determining a voltage loss value based on a difference between the voltage value and a default voltage value corresponding to the feature of the voltage distribution. In some embodiments, the feature of the voltage distribution can include at least one of a valley, a peak, a median, a mean, or a mode. In some embodiments, the charge loss can be determined using one or more data state metrics corresponding to a pre-retention voltage distribution for the block and one or more data state metrics corresponding to a post-retention voltage distribution for the block. It can be appreciated that in some embodiments, the pre-retention voltage distribution can correspond a default voltage distribution used as a benchmark against multiple block voltage distributions of the memory device. That is, the pre-retention voltage distribution (or related information) does not necessarily need to be measured or obtained from the block prior to the data retention duration, and, in some embodiments, can be supplied using a default stand-in set of similar representative data.

At operation 530, processing logic determines whether the charge loss value is greater than or equal to a charge loss threshold. In some embodiments, the charge loss threshold can correspond to an expected charge loss associated with the feature of the voltage distribution based on a data retention duration for data stored at the block. As described above, the charge loss threshold can correspond to a predicted, or expected charge loss threshold that is based in part on the length of the data retention duration. In some embodiments, the charge loss threshold can be calculated using a predetermined formula or algorithm associated with physical characteristics of the block and/or memory device.

At operation 540, responsive to determining the charge loss value is greater than or equal to the charge loss threshold, processing logic identifies the block as a healthy block. The processing logic can set a flag or change a bit in a designated register to identify the block as a healthy block. In some embodiments, the block can be assigned to a healthy block pool.

In some embodiments, responsive to determining the charge loss value is less than the charge loss threshold, processing logic can identify the block as a grown bad block. In some embodiments, grown bad blocks can be identified for retirement. In some embodiments, retirement candidates can be immediately retired by processing logic. In some embodiments, retirement candidates can be assigned to a retirement pool. Processing logic can process blocks in the retirement pool based on factors such as duration, quantity of retirement candidates in the retirement pool, available resources, type- and number of incoming host request, etc.

In some embodiments, a block can be associated with multiple charge loss values and respective charge loss thresholds. For example, and in some embodiments, the charge loss value can be a first charge loss value associated with a first portion of the block, and the charge loss threshold can be a first charge loss threshold associated with the first portion of the block, while the read error can be associated with a second portion of the block. Processing logic can perform operations 520-540 using a second charge loss value associated with the second portion of the block, and a second charge loss threshold associated with the second portion of the block respectively. In some embodiments, multiple charge loss values and respective charge loss thresholds can be associated with the first portion of the block (e.g., different features of a voltage distribution can be associated with different charge loss values and charge loss thresholds).

Figure 6:
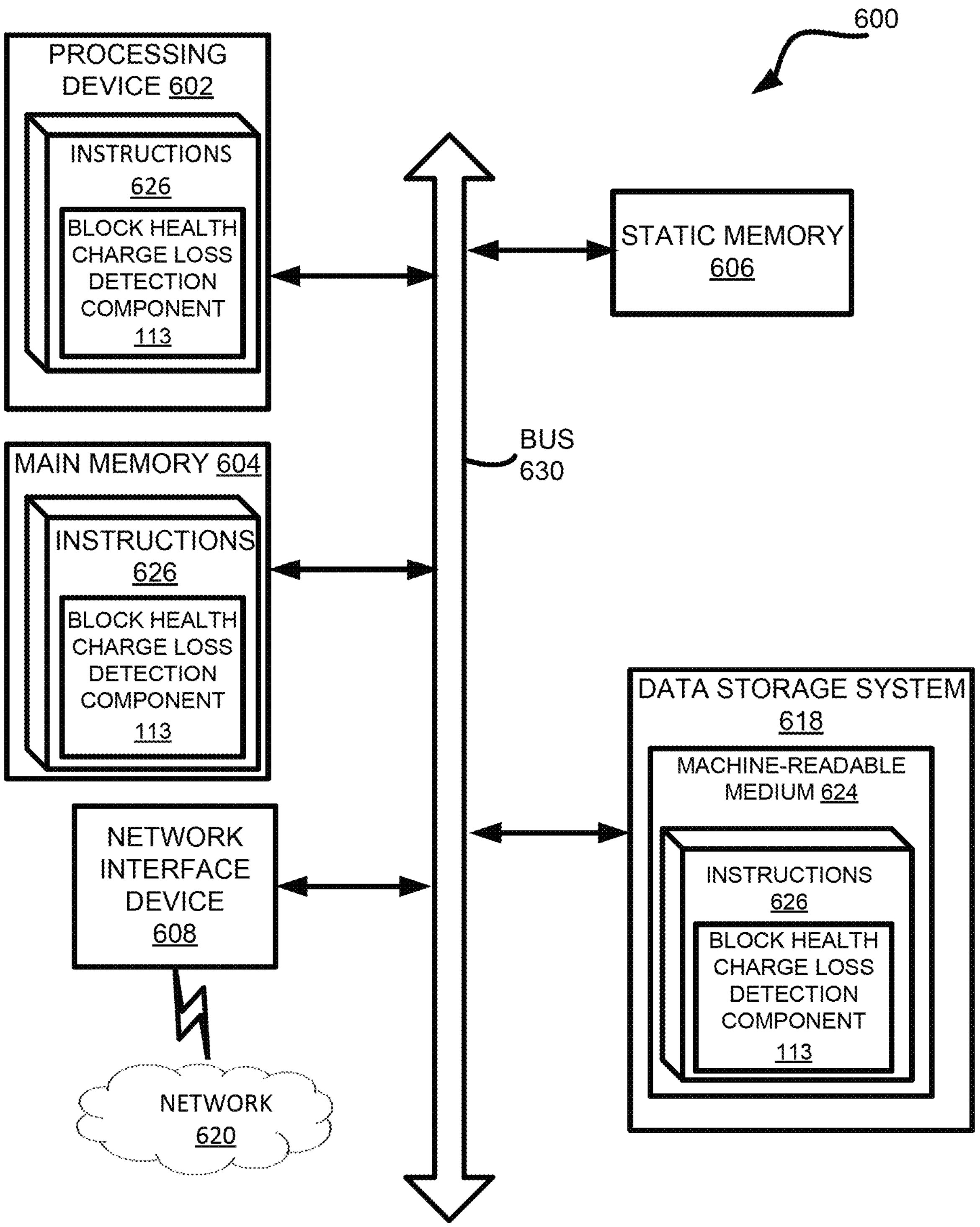
FIG. 6 is a block diagram of an example computer system in which embodiments of the disclosure can operate.

FIG. 6 illustrates an example of a computer system 600 within which a set of instructions, for causing the machine to perform any one or more of the methodologies discussed herein, can be executed, in accordance with aspects of the disclosure. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block health charge loss detection component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

In some embodiments, computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. In some embodiments, the data storage system 618 can include a computer-readable non-transitory storage medium, and can be operatively coupled to the processing device 602. The instructions 626 can also reside, completely or at least partially, within the main memory 604 and/or within the processing device 602 during execution thereof by the computer system 600, the main memory 604 and the processing device 602 also constituting machine-readable storage media. In some embodiments, the instructions 626 can be refer to executable instructions. The machine-readable storage medium 624, data storage system 618, and/or main memory 604 can correspond to the memory sub-system 110 of FIG. 1.

In some embodiments, the instructions 626 include instructions to implement functionality corresponding to the block health charge loss detection component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system comprising:

a memory device comprising a plurality of blocks;

a processing device operatively coupled with the memory device, the processing device to perform operations comprising:

identifying a read error internal to the memory sub-system and associated with a block of the plurality of blocks;

determining a charge loss value associated with the block;

determining whether the charge loss value is greater than or equal to a charge loss threshold; and responsive to determining the charge loss value is greater than or equal to the charge loss threshold, identifying the block as a healthy block.

2. The memory sub-system of claim 1, wherein determining the charge loss value associated with the block comprises:

determining a voltage value corresponding to a feature of a voltage distribution associated with the block; and using a difference between the voltage value and a default voltage value corresponding to the feature of the voltage distribution to determine the charge loss value.

3. The memory sub-system of claim 2, wherein the feature of the voltage distribution comprises at least one of a valley, a peak, a median, a mean, or a mode.

4. The memory sub-system of claim 1, wherein the charge loss threshold corresponds to an expected charge loss based on a data retention duration for data stored at the block.

5. The memory sub-system of claim 1, wherein the charge loss value is a first charge loss value associated with a first portion of the block, wherein the charge loss threshold is a first charge loss threshold associated with the first portion, and wherein the read error is associated with a second portion of the block, the operations further comprising:

determining a second charge loss value associated with the second portion of the block;

determining whether the second charge loss value is greater than or equal to a second charge loss threshold; and responsive to determining the second charge loss value is greater than or equal to the second charge loss threshold, identifying the block as the healthy block.

6. The memory sub-system of claim 5, wherein the first charge loss threshold is different from the second charge loss threshold.

7. The memory sub-system of claim 1, wherein identifying the read error associated with the block of the plurality of blocks comprises:

determining that the block has satisfied a criterion to be identified as a bad block.

8. A method comprising:

identifying a read error internal to a memory device associated with a block of the memory device;

determining a charge loss value associated with the block;

determining whether the charge loss value is greater than or equal to a charge loss threshold; and responsive to determining the charge loss value is greater than or equal to the charge loss threshold, identifying the block as a healthy block.

9. The method of claim 8, wherein determining the charge loss value associated with the block comprises:

determining a voltage value corresponding to a feature of a voltage distribution associated with the block; and using a difference between the voltage value and a default voltage value corresponding to the feature of the voltage distribution to determine the charge loss value.

10. The method of claim 9, wherein the feature of the voltage distribution comprises at least one of a valley, a peak, a median, a mean, or a mode.

11. The method of claim 8, wherein the charge loss threshold corresponds to an expected charge loss based on a data retention duration for data stored at the block.

12. The method of claim 8, wherein the charge loss value is a first charge loss value associated with a first portion of the block, wherein the charge loss threshold is a first charge loss threshold associated with the first portion, and wherein the read error is associated with a second portion of the block, the method further comprising:

determining a second charge loss value associated with the second portion of the block;

determining whether the second charge loss value is greater than or equal to a second charge loss threshold; and responsive to determining the second charge loss value is greater than or equal to the second charge loss threshold, identifying the block as the healthy block.

13. The method of claim 12, wherein the first charge loss threshold is different from the second charge loss threshold.

14. The method of claim 8, wherein identifying the read error associated with the block comprises:

determining that the block has satisfied a criterion to be identified as a bad block.

15. A computer-readable non-transitory storage medium comprising executable instructions that, when executed by a controller managing a memory device comprising a plurality of memory cells, cause the controller to perform operations comprising:

identifying a read error internal to the memory device and associated with a block;

determining a charge loss value associated with the block;

determining whether the charge loss value is greater than or equal to a charge loss threshold; and responsive to determining the charge loss value is greater than or equal to the charge loss threshold, identifying the block as a healthy block.

16. The computer-readable non-transitory storage medium of claim 15, wherein determining the charge loss value associated with the block comprises:

determining a voltage value corresponding to a feature of a voltage distribution associated with the block; and using a difference between the voltage value and a default voltage value corresponding to the feature of the voltage distribution to determine the charge loss value.

17. The computer-readable non-transitory storage medium of claim 16, wherein the feature of the voltage distribution comprises at least one of a valley, a peak, a median, a mean, or a mode.

18. The computer-readable non-transitory storage medium of claim 15, wherein the charge loss threshold corresponds to an expected charge loss based on a data retention duration for data stored at the block.

19. The computer-readable non-transitory storage medium of claim 15, wherein the charge loss value is a first charge loss value associated with a first portion of the block, wherein the charge loss threshold is a first charge loss threshold associated with the first portion, and wherein the read error is associated with a second portion of the block, the operations further comprising:

determining a second charge loss value associated with the second portion of the block;

determining whether the second charge loss value is greater than or equal to a second charge loss threshold, wherein the first charge loss threshold is different from the second charge loss threshold; and responsive to determining the second charge loss value is greater than or equal to the second charge loss threshold, identifying the block as the healthy block.

20. The computer-readable non-transitory storage medium of claim 15, wherein identifying the read error associated with the block comprises:

determining that the block has satisfied a criterion to be identified as a bad block.

* * * * *